United States Patent [19]

Horikawa et al.

[11] Patent Number: 5,352,897
[45] Date of Patent: Oct. 4, 1994

[54] DEVICE FOR DETECTING X-RAYS

[75] Inventors: Yoshiaki Horikawa, Hachiouji; Yoshinori Iketaki, Oume; Shoichiro Mochimaru; Koumei Nagai, both of Hachiouji, all of Japan

[73] Assignee: Olympus Optical Co., Ltd., Tokyo, Japan

[21] Appl. No.: 31,470

[22] Filed: Mar. 15, 1993

[30] Foreign Application Priority Data

Mar. 16, 1992 [JP] Japan .................................. 4-058040
Apr. 30, 1992 [JP] Japan .................................. 4-111620
Jun. 23, 1992 [JP] Japan .................................. 4-164896
Jun. 23, 1992 [JP] Japan .................................. 4-164897

[51] Int. Cl.$^5$ .............................................. G01T 1/24
[52] U.S. Cl. ........................... 250/370.06; 250/370.01; 250/370.09; 257/428
[58] Field of Search ...................... 250/370.06, 370.01, 250/370.09; 257/428, 440

[56] References Cited

U.S. PATENT DOCUMENTS 4,926,052  5/1990  Hatayama et al. ............. 250/370.01

FOREIGN PATENT DOCUMENTS 224253  9/1988  Japan ............................. 250/370.06

OTHER PUBLICATIONS

Arata et al., "Multichannel Measurement of Soft X-ray with MCP and OMA System", Trans. of JWRI, vol. 12 No. 1 1983, pp. 51–55.
Sayre et al., "X-Ray Microscopy II", Optical Sciences, pp. 124–129.
Applied Physics of Electronic Materials, Corona Publishing, 1989, pp. 126–131 and p. 250.
J. Barth et al., "Characteristics and applications of semiconductor . . .", SPIE vol. 733, 1986, pp. 481–485.
Kenji Miyata et al., "Amplified MOS Imager", ITEJ Technical Report vol. 14, Feb. 1990, pp. 33–38.
Forbes R. Powell et al., "Thin film filter performance for extreme . . .", Optical Engineering, Jun. 1990, pp. 614–624.
Edward D. Palik, "Handbook of Optical Constants of Solids", Academic Press, Inc., 1985, pp. 284–285 and 398–399.
Henke et al., "Low energy X-ray interaction . . .", Atomic Data and Nuclear Data Tables, vol. 27, 1982.

Primary Examiner—Carolyn E. Fields
Attorney, Agent, or Firm—Cushman, Darby & Cushman

[57] ABSTRACT

A soft X-ray detector includes a surface electrode layer, a photoelectric conversion layer, and a semiconductor detector having an electrode connected to the photoelectric conversion layer, for detecting an electric charge produced In the photoelectric conversion layer. The photoelectric conversion layer and the surface electrode layer have thicknesses satisfying conditions $$dA \geqq 0.183\lambda/KA$$

$$dB \leqq 0.183\lambda/KB$$

where dA is a thickness of the photoelectric conversion layer, dB is a thickness of the surface electrode layer, KA is an extinction coefficient of radiation of a wavelength $\lambda$ in a substance constituting the photoelectric conversion layer, and KB is an extinction coefficient of radiation of the wavelength $\lambda$ in a substance constituting the surface electrode layer. Thus, the soft X-ray detector has a high sensitivity to soft X rays and a lower sensitivity to visible light, so that only soft X rays can be selectively detected. Further, the detector has two kinds of pixels, with one kind sensitive to soft X-rays and the other kind sensitive to visible light. In addition, the detector includes a plurality of pixels, to which the surface electrode layer is divided to correspond so that it has a plurality of regions to obtain a desired wavelength.

15 Claims, 8 Drawing Sheets

DEVICE FOR DETECTING X-RAYS

BACKGROUND OF THE INVENTION

1. Field of tile Invention

This invention relates to a soft X-ray detector used as an image sensor for X-ray telescopes, soft X-ray microscopes, soft X-ray examining devices, etc.

2. Description of the Related Art

Soft X-ray detectors are known as microchannel plates (MCP), scintillation counters, imaging plates, semiconductor detectors, and soft X-ray solid-state image sensors such as charge-coupled devices (CCD).

FIGS. 1 and 2 are schematic views of a structure of the MCP. As evident from FIG. 1, an MCP 1 is composed of a bundle of numerous microchannels 2. Each of the microchannels 2 is made of a tiny glass pipe whose inner wall is formed as the combination of a resistor and a secondary electron emitter, and constitutes an independent secondary electron multiplier tube. Secondary electrons are emitted from the inner wall by radiation, such as soft X rays, or electrons incident on the microchannel 2. They are then accelerated by an electric field due to a high voltage applied to both ends of the microchannel 2, and travel through the microchannel while impinging on the inner wall in succession. In this process, the number of electrons is multiplied. The electrons are received on a fluorescent surface and then detected by the solid-state Image sensor such as the CCD.

The MCP is easy of use, because it has no sensitivity to visible light and brings about a desired spectral sensitivity by properly choosing a photoelectric converting surface. The MCP, however, is high In cost and needs a high voltage, with the result that its structure is complicated. Further, the thickness of the microchannel 2 is 12 $\mu$m at a minimum, so that a spatial resolution is restricted in its improvement, with no less than about 30 $\mu$m at present.

The imaging plate is a detector utilizing a photostimulated luminescence. Here, the photostimulated luminescence indicates that a substance first excited, for example, by soft X rays, is then Irradiated with Infrared light and emits light again. In the imaging plate, the substances exhibiting the photostimulated luminescence are distributed over the plate, and soft X rays, after exposure, can be read out by the two-dimensional scan of laser light. The resolving power depends on the diameter of a laser spot on reading out. Thus, although the spatial resolution is favorable, a readout mechanism is required. Consequently, there are defects that the structure is complicated and real time for signal detection is insufficient.

FIG. 3 shows the structure of a conventional CCD solid-state Image sensor used In the detection of soft X rays. In this figure, reference numeral 10 represents a photodiode in which an n$^-$-type region 12 is provided on the surface of a p-type substrate; 13 a transfer gate provided in a region adjacent to the diode 10; 14 an aluminum tight shield provided in the upper region of the transfer gate 13; and 15 Incident radiation. The incident radiation 15 entering the solid-state image sensor reaches the photodiode 10, where it is converted photoelectrically and a resultant electric signal is transferred through the transfer gate 13. The aluminum light shield 14 is constructed so as to prevent a noise from entering the transfer gate 13. The conventional solid-state Image sensor, which is thus provided with the aluminum light shield 14, is complicated in surface structure and, as shown in FIG. 3, has needed a protective film 16 with a thickness of 3 to 5 $\mu$m in order to maintain such a structure. Since the protective film 16 absorbs the most of soft X rays from the incident radiation, a very small amount of the soft X rays will reach the photodiode 10. For this reason, in the case where soft X rays are detected, the surface of the CCD is coated with a fluorescent film, such as Gd$_2$O$_2$S : Tb, so that the soft X rays are converted through the fluorescent film into visible light, which is then converted photoelectrically (for instance, Springer-Verlag, X-ray Microscope II, p. 127, 1987). This image sensor, however, is smaller in quantum efficiency than unity, low In conversion efficiency, and poor in sensitivity.

With devices using such a solid-state image sensor for detecting soft X rays, light of wavelengths except for the soft X ray region is emitted from a laser plasma radiation source or a radiation source of successive wavelengths such as spectral radiation (SR). As a consequence, for example, visible light is incident on the solid-state image sensor in combination with soft X rays, and forms the noise with respect to the soft X rays. Thus, as In soft X-ray microscopes for instance, when only soft X rays of short wavelengths are detected to derive an image for observation of high resolution, it is necessary to remove light other than the soft X rays incident on the solid-state image sensor by means of, for example, a spectroscope, in order to prevent the combination of the image with the visible light. With such a manner, however, the device is oversized and complicated, and hence loses the merit that the solid-state image sensor is used as the soft X-ray detector.

The above prior art can bring about only an image corresponding to light of a particular wavelength band predetermined In the design stage. This makes it disadvantageous to compare the image of soft X rays with that of visible light, for instance. In such a case, the MCP and the CCD can be switched for use. This, however, causes problems that the mechanism is complicated and at the same time, imaging becomes impossible.

Further, in order to obtain the image of light of a desired wavelength from white light, such as spectral radiation, it is necessary to monochromatize the light through a diffraction grating or a zone plate. In this case, there is the disadvantage that one optical element must be added. Moreover, an Imaging element, such as an objective lens using a multilayer film, although capable of making use of its wavelength choosing property, must be limited to the range of the designed particular wavelengths. Additionally, the multilayer film itself is high in cost.

SUMMARY OF THE INVENTION

It is, therefore, a primary object of the present invention to provide a soft X-ray detector which has a high sensitivity, is low in cost, and permits easy operation.

Another object of the present invention is to provide a soft X-ray detector which has a low sensitivity to ultraviolet and visible light except for the soft X-ray region and can selectively detect soft X rays only.

Still another object of the present invention is to provide a soft X-ray detector which has high sensitivity and resolution and can properly use a plurality of wavelength bands.

A further object of the present invention is to provide a soft X-ray detector which has high sensitivity and resolution and can selectively detect the light of a particular wavelength.

According to one aspect of the present invention, the soft X-ray detector is provided with a lamination structure having a surface electrode layer of thickness enough to transmit soft X rays and a photoelectric conversion layer converting photoelectrically the soft X rays, on the entrance side of a semiconductor detector. Thus, an electric charge generated in the photoelectric conversion layer is detected by the semiconductor detector, and thereby the soft X rays are detected. The surface electrode layer transmits at least 10 % of soft X rays, while the photoelectric conversion layer absorbs at least 90% thereof. If, therefore, the electric charge generated from the soft X rays absorbed by the photoelectric conversion layer is detected by the semiconductor detector, the soft X-ray detector having a good sensitivity to soft X rays can be realized. In addition to this construction, If a filter is disposed for removing unwanted light, such as visible light, on the entrance side of the surface electrode layer, or if the substance and thickness of the surface electrode layer are properly chosen so that the surface electrode layer itself can remove the visible light, the soft X-ray detector by which only soft X rays can be effectively detected will be realized.

According to another aspect of the present invention, the soft X-ray detector comprises the photoelectric conversion layer and the surface electrode layer laminated in order, and uses a substance having a band gap of at least 3 eV for the photoelectric conversion layer. Since such a substance has an extremely low sensitivity to visible and ultraviolet light and is very high in carrier mobility, it is suitable for the detection of soft X rays. Hence, the use of the substance for the photoelectric conversion layer makes it possible to selectively detect soft X rays.

According to still another aspect of the present invention, the soft X-ray detector includes a laminated solid-state Image sensor which provides the photoelectric conversion layer on a pixel electrode and the surface electrode layer on the photoelectric conversion layer. This Image sensor is composed of at least two kinds of pixels having sensitivity to radiation of different wavelength bands. Further, the soft X-ray detector comprises one pixel having sensitivity to soft X rays and the other pixel to visible light so that they are alternately arrayed on its light-receiving surface.

According to a further aspect of the present invention, the soft X-ray detector Includes the laminated solid-state Image sensor which provides the photoelectric conversion layer on the pixel electrode and the surface electrode layer on the photoelectric conversion layer. This Image sensor is composed of at least two kinds of pixels in which substances forming the surface electrode layer are different from each other. The pixels constituting at least two kinds are constructed so that the absorption edges of the substances forming the surface electrode layer approach each other. One of at least two kinds of pixels is such that the surface electrode layer is constructed with the electrode alone. Further, the pixels are alternately arrayed along the light-receiving surface.

These and other objects as well as the features and advantages of the present Invention will become apparent from the following detailed description of the preferred embodiments when taken in conjunction with the accompanying drawings.

DETAILED DESCRIPTION OF THE PREFERRED EMBODIMENTS

Figure 1:
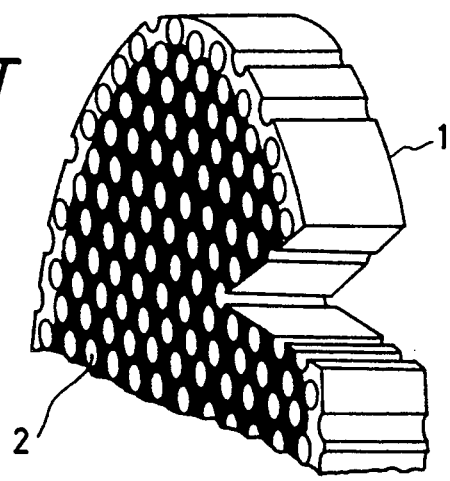
FIG. 1 is a sectional perspective view showing an essential part of a microchannel plate as a conventional soft X-ray detector.
Figure 2:
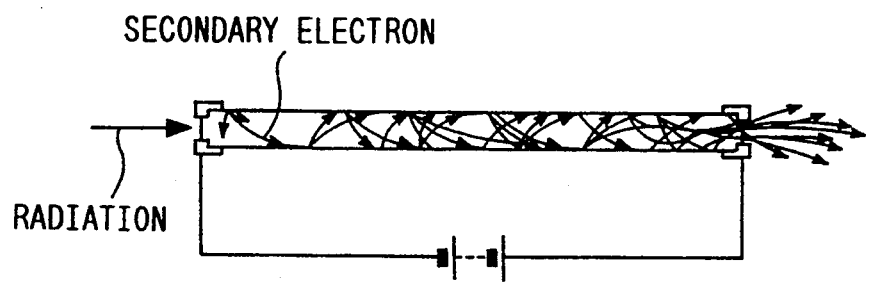
FIG. 2 is a sectional side view for explaining the behavior of the microchannel plate.
Figure 3:
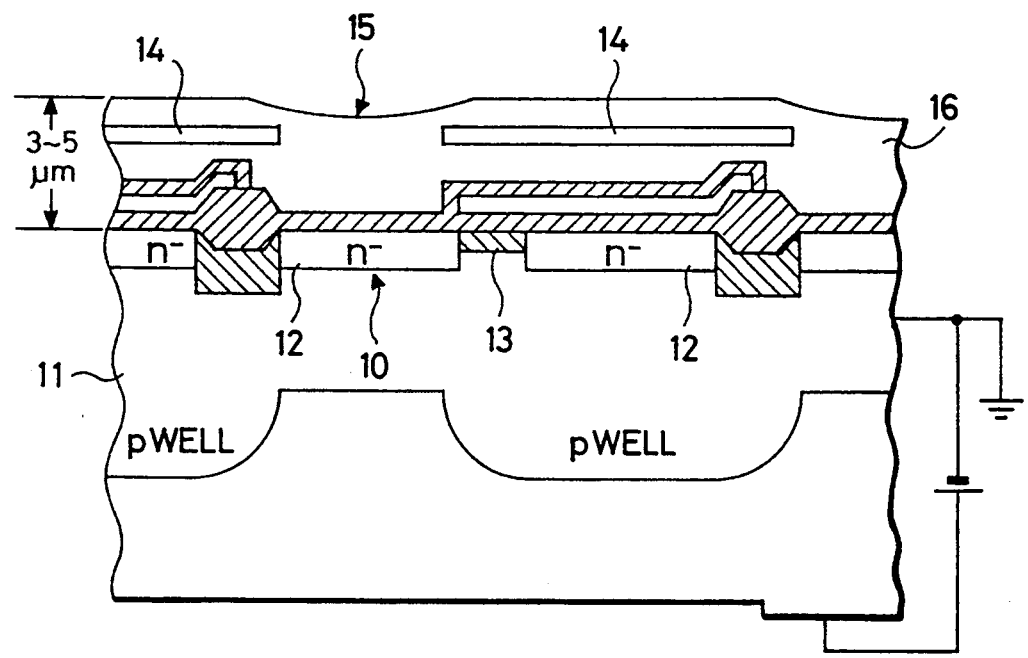
FIG. 3 is a sectional view showing a conventional CCD solid-state IMAGE sensor used for the detection of soft X rays.

Referring to the drawings shown, the embodiments of the present Invention will be described in detail below.

First embodiment

Figure 4:
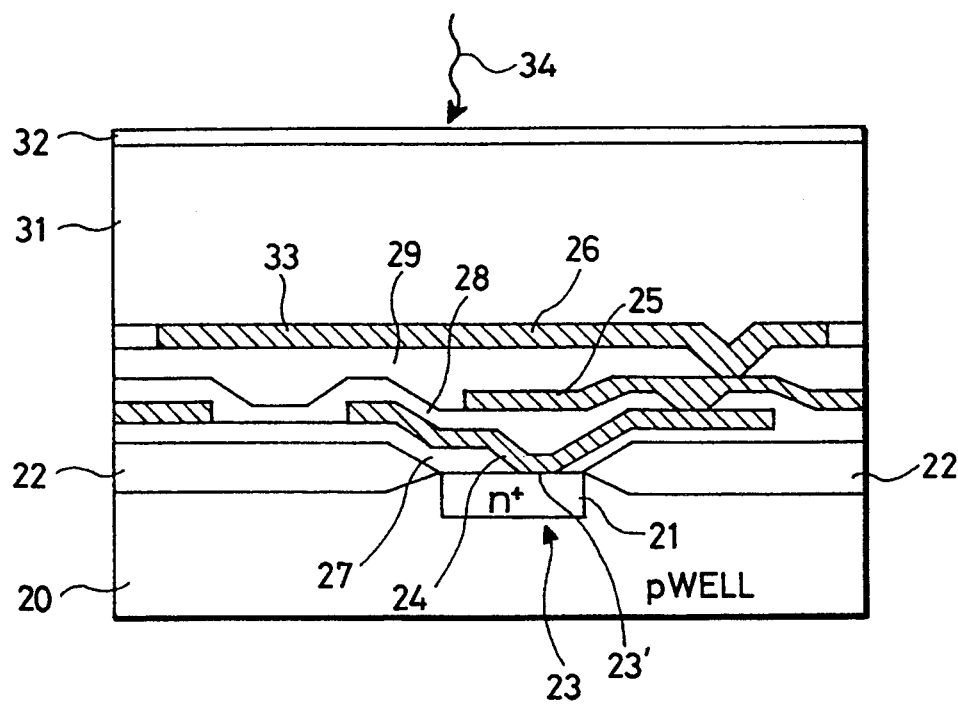
FIG. 4 is a sectional view showing an essential part of a first embodiment of a soft X-ray detector according to the present Invention.
Figure 5:
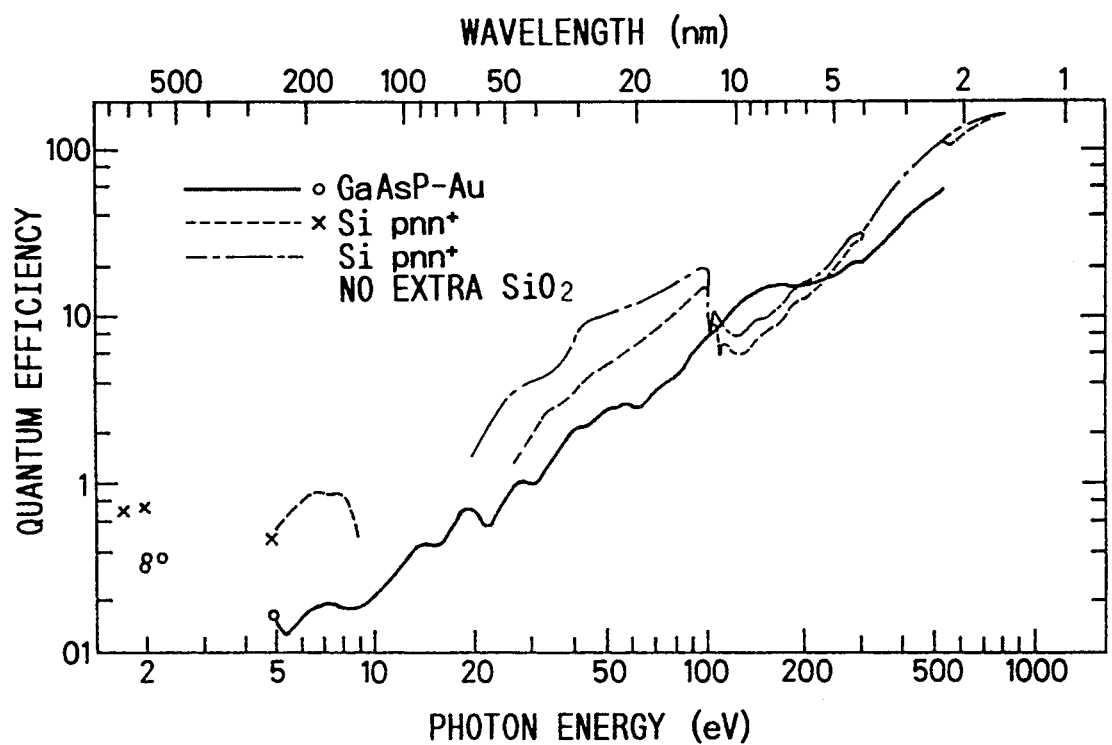
FIG. 5 is a characteristic diagram showing the relationship between the wavelength of light or the photon energy and the quantum efficiency In a semiconductor.

FIG. 4 shows the section of one pixel of an X-ray image sensor using an amplified MOS imager (AMI). In this figure, a diode 23 provided with an n+-type region 21 is formed on the surface of a p-type substrate 20, and a field oxide film 22 covers the surface of the substrate 20. A contact section 23' of the diode 23 is connected to a photoelectric conversion layer 31 through a first aluminum layer 24, a second aluminum layer 25, and a third aluminum layer 25. Reference numerals 27, 28, and 29 represent Insulating films composed of $SiO_2$ for electrically Insulating the first, second, and third aluminum layers 24, 25, and 26, respectively; 32 a surface electrode layer placed on the photoelectric conversion layer 31; 33 a pixel electrode; and 34 a soft X ray. $Si_3N_4$ layers about 100 Å thick acting as rectifiers are often interposed between tile photoelectric conversion layer 31 and the surface electrode layer 32 and between the photoelectric conversion layer 31 and the pixel electrode 33. Thus, since the photoelectric conversion layer 31 making photoelectric conversion is merely coated with the thin surface electrode layer 32, tile soft X rays 34 incident on the sensor reach the photoelectric conversion layer 31 without attenuating. Hence, it is possible to increase sensitivity to soft X rays. Semiconductors, such as Si and GaAsP, are employed as substances constituting the photoelectric conversion layer 31, and have a high sensitivity to soft X rays, namely, a great quantum efficiency. For example, as shown in FIG. 5, the quantum efficiency of an Si diode or a GaSaP-Au Schottky diode in terms of soft X rays approximates to 100 (Proc. SPIE, p. 481, 1986). In other words, when the photoelectric conversion layer 31 is taken as the lamination structure and employs the substance of high sensitivity, the sensitivity for the soft X-ray detector can be improved.

Figure 6:
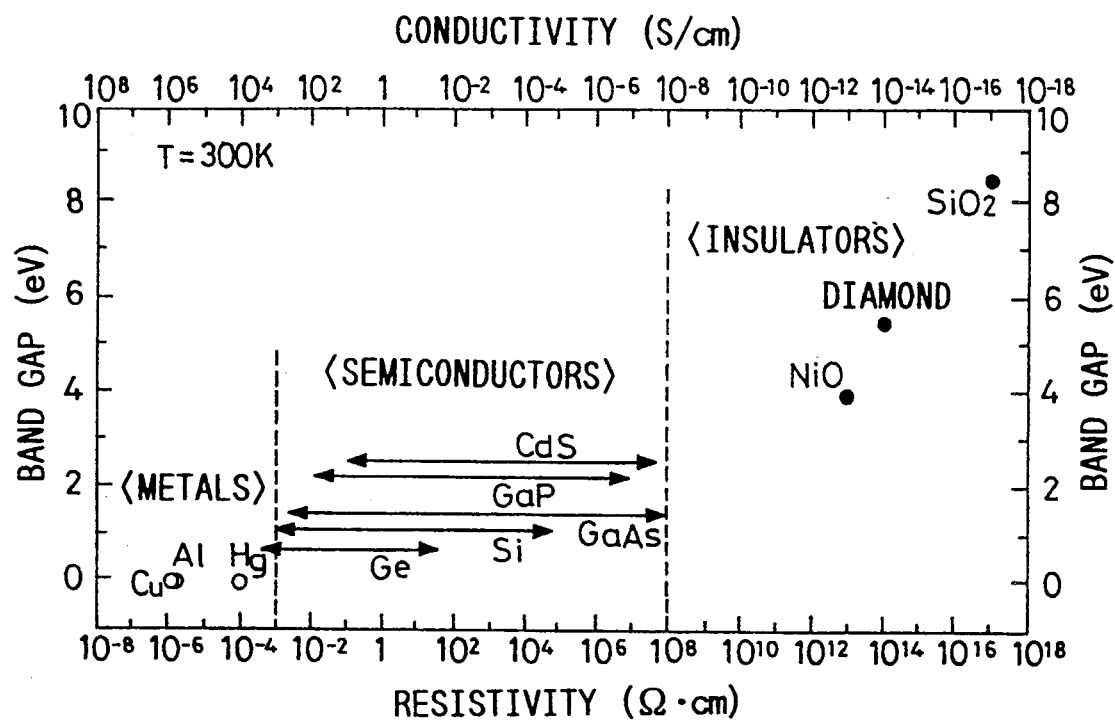
FIG. 6 is a diagram showing the electrical characteristics of metals, semiconductors, and insulators, and their band gaps.

FIG. 6 shows the band gaps of various substances. Since, as is evident from this diagram, the radiation energy in the soft X-ray region is more than 20 eV, the valence electrons of all semiconductors and insulators can be excited with respect to the conduction band. Although all semiconductors and insulators can thus be utilized as the photoelectric conversion layer 31, the semiconductors excel in view of the mobility of electrons and holes. The band gaps of principal compound semiconductors at room temperature are given in FIG. 7, Applied Physics of Electronic Materials, Corona Publishing, 1989, pages 126–131 and page 250.

Next, reference is made to the conditions of choosing the thicknesses of respective layers to remove unwanted light except for the soft X-ray region while holding the sensitivity to soft X rays, in regard to the removal of visible light as an example. As mentioned above, the photoelectric conversion layer 31, when using the semiconductor, has sensitivity to radiation over a wide wavelength region from visible light to soft X rays. In this case, if a substance used for the surface electrode layer 32 is chosen so as to have properties of reflecting or absorbing visible light and transmitting soft X rays, the visible light can be effectively eliminated. Oxides, such as $InSnO_2$ and $SiO_2$, or metals are favorable for the substances of the surface electrode layer 32. In order to reflect or absorb visible light and transmit soft X rays, however, it is necessary to adequately choose the thickness of the surface electrode layer 32. That is, when an absorption coefficient (or extinction coefficient) of a complex index of refraction at a wavelength X is denoted by K, an intensity transmittance T of radiation in the substance of a thickness d to that of the wavelength λ is expressed by $$T = exp\{-4\pi Kd/\lambda\} \quad (1)$$

The extent of the conversion efficiency in the photoelectric conversion layer 31 is proportional to that of the absorptance of soft X rays In the photoelectric conversion layer 31. In other wards, the smaller the amount of soft X rays transmitted through the photoelectric conversion layer 31, the higher the conversion efficiency. Calling dA the thickness of the photoelectric conversion layer 31 and KA the absorption coefficient (or extinction coefficient) relative to soft X rays of a wave length λx, a transmittance TX of the soft X rays is given by $$Tx = exp\{-4\pi K_A d_A/\lambda x\} \quad (2)$$

Hence, the condition of the thickness dA corresponding to the transmittance Tx or lower becomes $$dA \geq -lnTx\, \lambda x/(4\pi K_A) \quad (3)$$

where in is the natural logarithm. As an example, for the condition of the thickness dA where at least 90% of soft X rays incident on the photoelectric conversion layer 31 is absorbed, substitution of the transmittance Tx=0.1 in Eq. (3) yields $$dA \geq 0.183\, \lambda x/KA \quad (4)$$

For the surface electrode layer 32, on the other hand, it is necessary to minimize the amount of absorption of soft X rays. To secure the highest absorptance of soft X rays of 90% in the surface electrode layer 32, namely, the transmittance of at least 10%, depending on the extent of the conversion efficiency of the photoelectric conversion layer 31, the condition of a thickness ds of the surface electrode layer 32 is expressed, opposite to Eq. (4), as $$dB \leq 0.183\, \lambda x/KB \quad (5)$$

where KB is the absorption coefficient (or extinction coefficient) of the surface electrode layer 32 in terms of soft X rays of the wavelength λx.

Also, In order to effectively remove visible light in the surface electrode layer 32, it is necessary to properly choose the thickness of the surface electrode layer 32. Calling Kv the absorption coefficient (or extinction coefficient) relative to visible light of a wavelength λv In the surface electrode layer 32 and Kx the absorption coefficient (or extinction coefficient) relative to soft X rays of a wavelength λx, the condition of a thickness dB of the substance where the transmittance of the soft X rays in the surface electrode layer 32 is no less than N times that of the visible light is given from Eq. (1) as $$N\, exp\{-4\pi K_v dB/\pi v\} \leq exp\{-4\pi K_x dB/\lambda x\} \quad (6)$$

This equation is rewritten In terms of the thickness ds as follows:

$$dB \geq -lnN/\{-4\pi(Kv/\lambda v - Kx/\lambda x)\} \quad (7)$$

This is the condition of the thickness ds for eliminating unwanted light. For example, the case where N:100 gives $$dB \geq 0.366/(Kv/\lambda v - Kx/\lambda x) \quad (8)$$

and the case where N:1000 gives $$dB \geq 0.55/(K_v/\lambda_v - K_x/\lambda_x) \tag{9}$$

To effectively detect soft X rays in practical use, the transmittance of the soft X rays in the surface electrode layer 32 needs at least 0.1. Also, to effectively detect visible light, it is desirable that the transmittance of the visible light is no greater than one hundredth of that of the soft X rays.

The foregoing conditions also hold for the case where a filter is placed on the surface electrode layer 32 and visible light is removed by the function of the filter. Specifically, in this case, the condition of a thickness de of the filter that secures the transmittance of at least 10% is expressed as $$dC \leq 0.183 \lambda_x / KXF \tag{10}$$

where KXF is the absorption coefficient (or extinction coefficient) of the filter relative to the soft X rays of the wavelength λx. When the absorption coefficient (or extinction coefficient) relative to the visible light of the wavelength λv in the filter is represented by KVF, the condition of a thickness dc of the filter where the transmittance of the soft X rays in the filter is no less than N times that of the visible light is given from Eq. (1) as $$N \exp\{-4\pi KVF \, dc/\pi v\} \leq \exp\{-4\pi KXF \, dc/\pi \lambda_i\}$$

This equation is rewritten in terms of the thickness dc as follows:

$$dc \geq -\ln N / \{-4\pi(KVF/\pi v - KXF/\lambda X)\} \tag{12}$$

This is the condition of the thickness dc for eliminating unwanted light. For example, the case where N=100 gives $$dc \geq 0.366/(KVF/\lambda V - KXF/\lambda X) \tag{13}$$

and the case where N=1000 gives $$dc \geq 0.55/(KVF/\lambda V - KXF/\lambda X) \tag{14}$$

Metals, such as Be, Al, Sc, Ti, V, Cr, Mn, Fe, Co, Nl, Cu, Zn, Mo, Ag, In, W, Pt, and Au, cause metallic reflection with respect to visible light. Further, these metals transmit little visible light when their individual thicknesses are 0.05~0.1 μm or more, so that they are favorable for substances of the surface electrode layer 32 and the filter. Al, Cu, Ag, and Au are low in electric resistance and peculiarly suitable for the electrode. For these metals, however, the absorption edges of the elements exist in the soft X-ray region and hence, where account is taken of the conversion efficiency of soft X rays, it is favorable to choose substances such that the absorption of soft X rays is minimized regarding wavelengths available.

Figure 8:
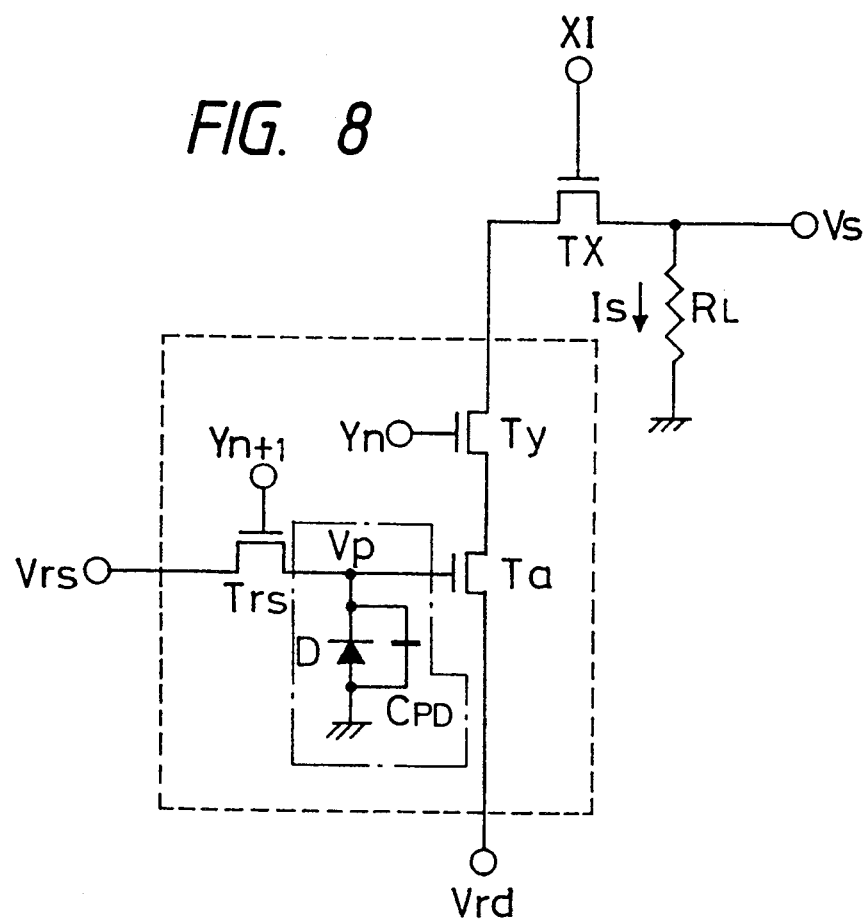
FIG. 8 is a diagram showing the equivalent circuit of the soft X-ray detector in FIG. 4.

Next, a description is made of a procedure of reading out an electric charge for detection photoelectrically converted. FIG. 8 shows the equivalent circuit of the Image sensor, including the sectional view of FIG. 4 enclosed with a chain line. In this figure, one pixel is shown enclosed with a broken line. The AMI is an XY address element which amplifies an optical information signal derived from a photoelectric conversion section in the same pixel to read out it through vertical and horizontal scanning circuits.

One pixel of the AMI comprises an n+p photodiode D and three n channel MOSFETs for reset (Trs), amplification (Ta), and vertical selection (Ty). The operational principal is such that the photodiode D is reverse biased to emit a photoelectric charge generated from X rays in the photoelectric conversion layer 31 and its potential is amplified and taken out. First, during the reset period, the photodiode D is set through a transistor for reset Trs to an initial potential Vrs (positive potential). Second, during the storage period, electrons excited by the irradiation of the X rays are stored In a capacity CPD of the photodiode D. Hence, the potential of the photodiode D decreases according to the amount of Incident X rays. This potential is applied to the gate of an amplifier semiconductor Ta, and the current amplified according to the potential of the photodiode D is read out. Holes produced by the irradiation of the X rays flows into the surface electrode layer 32.

The foregoing is related to the operation in one pixel. In the case where this element is used as an area sensor, a transistor Ty is first brought into an on condition through the vertical scanning circuit during one horizontal scanning period, and a transistor Tx is then turned to an on state through the horizontal scanning circuit to read out one horizontal scanning line. After the readout of one horizontal scanning line is completed, the same operation is repeated with respect to the next horizontal scanning line so that a two-dimensional image signal is derived.

Since In this way the image sensor is constructed so that the converted signal is taken out after being amplified within the element, its conversion efficiency is high. Further, according to this construction, the thin surface electrode layer 32 is merely placed on the photoelectric conversion layer 31, and as such incident soft X rays can arrive at the photoelectric conversion layer 31 without any attenuation. Moreover, the Image sensor has a good sensitivity. Thus, the S/N ratio is unsurpassed and the output signal is 10~100 times as great as the ordinary CCD. It is also possible to Improve the S/N ratio by cooling. Additionally, there are advantages that a high vacuum ambient, such as in the MCP, is not required and the operation is easy.

The concrete examples of the structures of the surface electrode layer and the photoelectric conversion layer are given In the following tables. In these tables, the transmittance is taken as "1" where radiation is completely transmitted.

EXAMPLE 1

This example uses Al as the substance constituting the surface electrode layer and SI as the photoelectric conversion layer. The absorption coefficient of Al relative to visible light (for Instance, of wavelength 0.5166 μm) is 6.28 (Handbook of Optical Constants of Solids, Academic Press). In contrast, the absorption coefficient of Al relative to soft X rays (for instance, of wavelength 39.8 Å) is 0.02, and that of Si is 0.02 calculated from the Henke Table (B. L. Henke: Atomic Data & Nuclear Data Tables, Vol. 27, No. 1, pp. 1-144, 1982)]. Hence, the use of Eq. (1) to calculate the transmittances of the surface electrode layer leads to the values given in Table 1.

TABLE 1

| Thickness of Al surface electrode layer, μm | Transmittance of visible light | Transmittance of soft X rays |
|---|---|---|
| 0.3 | $1.25 \times 10^{-20}$ | 0.15 |

TABLE 1-continued

| Thickness of Al surface electrode layer, μm | Transmittance of visible light | Transmittance of soft X rays |
| --- | --- | --- |
| 0.1 | $2.3 \times 10^{-7}$ | 0.53 |
| 0.05 | $4.8 \times 10^{-4}$ | 0.73 |

From Eq. (7), the transmittances where N=1000 and N:100 are given In Table 2.

TABLE 2

| N | Thickness of Al surface electrode layer, Å | Transmittance of visible light | Transmittance soft X rays |
| --- | --- | --- | --- |
| 1000 | 472 | $7.42 \times 10^{-4}$ | 0.742 |
| 100 | 314 | $8.2 \times 10^{-3}$ | 0.82 |

The Al surface electrode layer having such thickness and the Si photoelectric conversion layer are formed as the AMI of the lamination type photodiode structure shown in FIG. 4. In this case, the thickness of the Si photoelectric conversion layer is 0.36 μm or more, from Eq. (4).

EXAMPLE 2

This example uses Cu as the substance constituting the surface electrode layer and Si as the photoelectric conversion layer to form the AMI of the lamination type photodiode structure. The absorption coefficient of Cu relative to visible light (of wavelength 0.5166 μm) is 2.60, while that relative to soft X rays (of wavelength 39.8 Å) is 0.004. The use of Eq. (1) to calculate the transmittances of the surface electrode layer leads to the values given In Table 3.

TABLE 3

| Thickness of Cu surface electrode layer, μm | Transmittance of visible light | Transmittance of soft X rays |
| --- | --- | --- |
| 0.1 | $1.79 \times 10^{-3}$ | 0.282 |
| 0.05 | $4.23 \times 10^{-2}$ | 0.532 |

From Eq. (7), the transmittances where N=1000 and N=100 are given In Table 4.

TABLE 4

| N | Thickness of Cu surface electrode layer, Å | Transmittance of visible light | Transmittance of soft X rays |
| --- | --- | --- | --- |
| 1000 | 1365 | $1.78 \times 10^{-4}$ | 0.178 |
| 100 | 909 | $3.18 \times 10^{-3}$ | 0.318 |

EXAMPLE 3

This example uses Ag as the substance constituting the surface electrode layer and Si as the photoelectric conversion layer to form the AMI of the lamination type photodiode structure. The absorption coefficient of Ag relative to visible light (of wavelength 0.5166 μm) is 3.07, while that relative to soft X rays (of wavelength 39.8 Å) is 0.004. The use of Eq. (1) to calculate the transmittances of the surface electrode layer leads to the values given In Table 5.

TABLE 5

| Thickness of Ag surface electrode layer, μm | Transmittance of visible light | Transmittance of soft X rays |
| --- | --- | --- |
| 0.1 | $5.71 \times 10^{-4}$ | 0.498 |
| 0.05 | $2.40 \times 10^{-2}$ | 0.706 |

From Eq. (7), the transmittances where N=1000 and N=100 are given in Table 6.

TABLE 6

| N | Thickness of Ag surface electrode layer, Å | Transmittance of visible light | Transmittance of soft X rays |
| --- | --- | --- | --- |
| 1000 | 1021 | $4.90 \times 10^{-4}$ | 0.490 |
| 100 | 679 | $6.25 \times 10^{-3}$ | 0.625 |

EXAMPLE 4

In this example, a thin film about 0.05 to 0.2 μm thick is formed of each substance of Be, Sc, and Ti, and is used as a filter of the AMI of the lamination type photodiode structure. Each of Be, Sc, and Ti is small in absorption coefficient In the soft X-ray region (an absorption coefficient of 0.001 or less at a 39.8 Å wavelength), and brings about metallic reflection with visible light, thus being suitable for the substance of the filter.

The absorption coefficients and transmittances of the filter substances in terms of soft x rays of wavelength 39.8 Å are given in Table 7.

TABLE 7

| | Absorption coefficient | Transmittance of soft X rays |
| --- | --- | --- |
| Be | 0.0009 | 0.86 |
| | | 0.57 |
| Sc | 0.0006 | 0.91 |
| | | 0.68 |
| Ti | 0.0009 | 0.86 |
| | | 0.57 |

In Table 7, each upper part in the right column indicates the case of a filter 0.05 μm thick and each lower part a filter 0.2 μm thick. As evident from Table 7, each substance shown is favorable for the filter because the transmittance of soft X rays is more than 50% even with a thickness of 0.2 μm and the reflectance of visible light is very nearly zero.

EXAMPLE 5

Figure 9A:
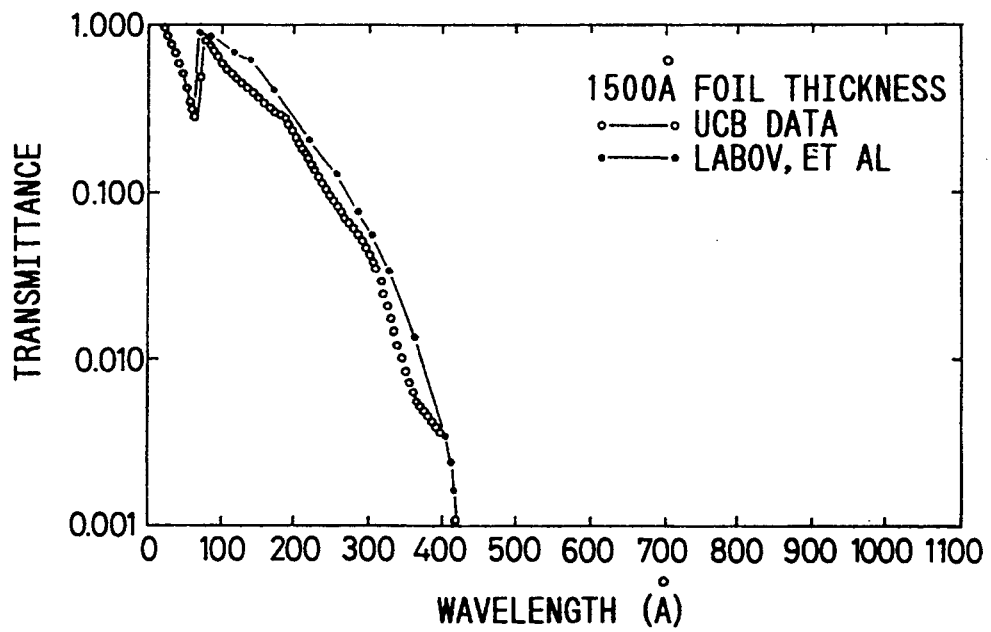
FIGS. 9A and 9B are diagrams showing the spectral transmittances of a B filter 1500 Å thick and a C filter 1000 Å thick, respectively.
Figure 9B:
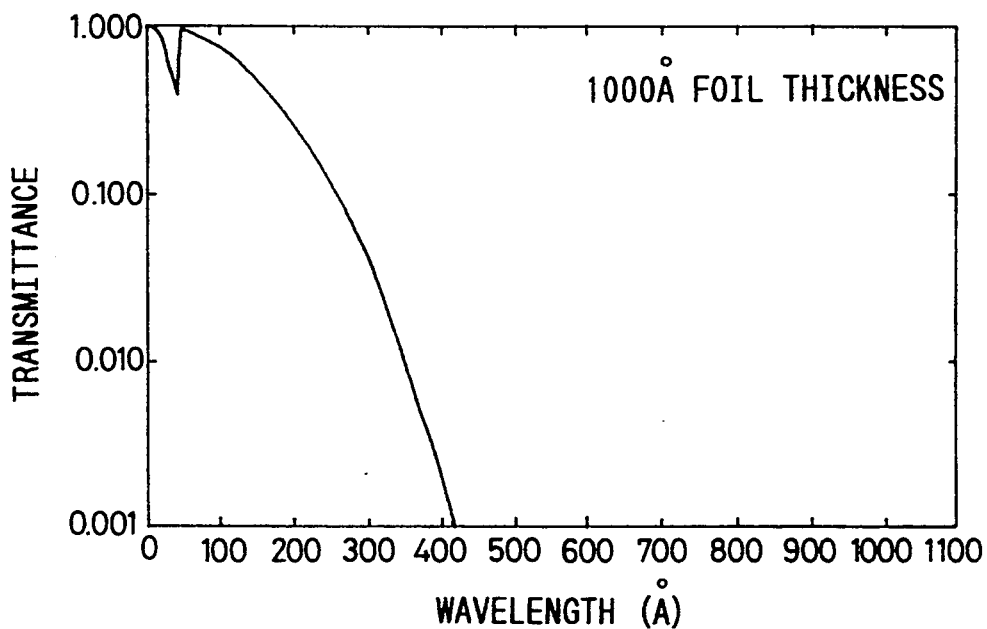

This example forms the AMI of the lamination type photodiode structure having an Al surface electrode layer 300 Å thick and an Si photoelectric conversion layer 2 μm thick. Further, the Al surface electrode layer has a filter built up with a B or C substance thereon. The spectral transmittances where a B filter is 1500 Å in thickness and a C filter is 1000 Å are shown In FIGS. 9A and 9B, respectively (Opt. Eng. 29 6, 614, 1990). A thin film formed of organic matter, such as Mylar, may well be used as the filter.

EXAMPLE 6

Figure 10:
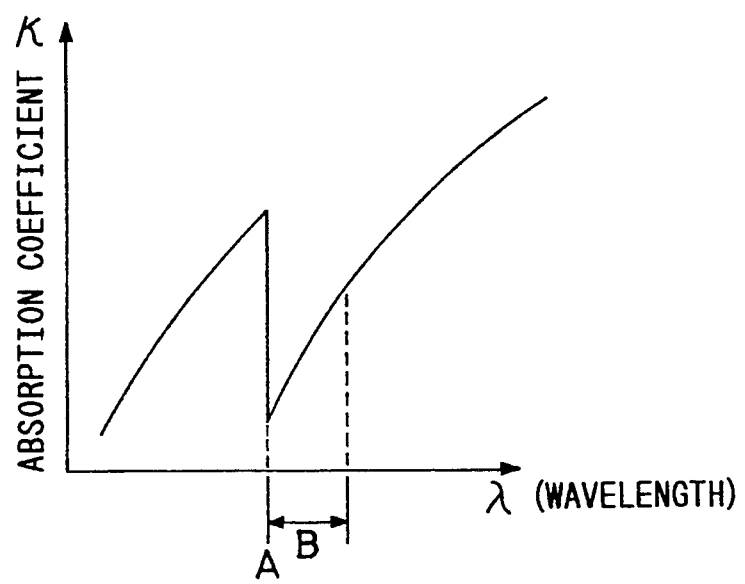
FIG. 10 is a graph showing the absorption coefficient (or extinction coefficient) of a substance.

In this example, a thin film about 0.05 to 0.2 μm thick is formed of a substance, such as Be, Al, Sc, Ti, V, Cr, Mn, Fe, Co, Ni, Cu, Zn, Mo, Ag, W, Pt, or Au, and is used as the AMI filter of the lamination type photodiode structure. Such a substance has the peak of the absorption coefficient In the soft X-ray region, and the absorption coefficient changes as shown in FIG. 10. Hence, in a wavelength region B of small absorption coefficients located on the long wavelength side of a peak A, the transmittance of soft X rays is improved. For invisible light, any substance mentioned above exhibits high reflectance due to metallic reflection, so that it can be used as a good filter in the wavelength region B.

For Cu, Au, Mo, Ni, Pt, Ag, and W, the concrete numerical values of the absorption coefficient and the transmittance are given in Table 8.

TABLE 8

| | Absorption coefficient with visible light (0.5166 μm) | Absorption coefficient (wavelength) in the vicinity of A | Transmittance of visible light | Transmittance of soft X rays | N |
|---|---|---|---|---|---|
| Cu | 2.60 | $1.74 \times 10^{-4}$ (13.78 Å) | $4.23 \times 10^{-2}$ $1.79 \times 10^{-3}$ | 0.92 0.85 | 21 474 |
| Au | 2.12 | $8.95 \times 10^{-3}$ (41.33 Å) | $7.60 \times 10^{-2}$ $5.76 \times 10^{-3}$ | 0.26 0.066 | 3 11 |
| Mo | 3.78 | $2.4 \times 10^{-3}$ (56.76 Å) | $1.00 \times 10^{-2}$ $1.00 \times 10^{-4}$ | 0.77 0.60 | 77 6000 |
| Ni | 3.06 | $6.3 \times 10^{-4}$ (14.45 Å) | $2.42 \times 10^{-2}$ $5.8 \times 10^{-4}$ | 0.76 0.58 | 31 1000 |
| Pt | 3.54 | $1.11 \times 10^{-2}$ (40.92 Å) | $1.35 \times 10^{-2}$ $1.82 \times 10^{-4}$ | 0.18 0.033 | 13 181 |
| Ag | 3.07 | $1.68 \times 10^{-3}$ (35.42 Å) | $2.39 \times 10^{-2}$ $5.7 \times 10^{-4}$ | 0.74 0.55 | 31 965 |
| W | 2.72 | $1.55 \times 10^{-2}$ (52.09 Å) | $3.66 \times 10^{-2}$ $1.3 \times 10^{-3}$ | 0.15 0.024 | 4 19 |

In Table 8, each upper part in the column of the transmittance of soft x rays indicates the case of a filter 0.05 μm thick and each lower part a filter 0.1 μm thick.

Wavelengths exhibiting high filter efficiencies In individual substances are as follows:
Be; wavelengths of 111 Å or more,
Al; wavelengths of 170 Å or more,
Sc; wavelengths of 30 Å or more,
Ti; wavelengths of 27 Å or more,
V; wavelengths of 24 Å or more,
Cr; wavelengths of 21 Å or more,
Mn; wavelengths of 19 Å or more,
Fe; wavelengths of 18 Å or more,
Co; wavelengths of 16 Å or more,
Ni; wavelengths of 14 Å or more,
Cu; wavelengths of 13 Å or more,
Zn; wavelengths of 12 Å or more,
Mo; wavelengths of 54 Å or more,
Ag; wavelengths of 34 Å or more,
W; wavelengths of 51 Å or more,
Pt; wavelengths of 40 Å or more,
Au; wavelengths of 37 Å or more.
Be, SC, and Ti, also shown in Example 4, have good filter characteristics, not only at a wavelength of 39.8 Å but also in the wavelength region of Example 6.

EXAMPLE 7

Figure 11:
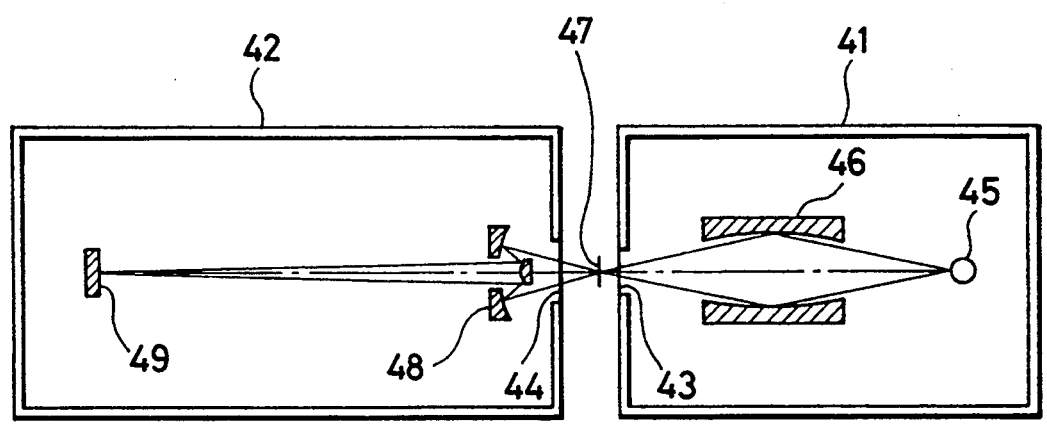
FIG. 11 is a view showing the arrangement where the soft X-ray detector is used in a soft X-ray microscope in the first embodiment.

This example utilizes the AMI as the soft X-ray detector of the soft X-ray microscope. FIG. 11 depicts the arrangement of an imaging soft X-ray microscope using a laser plasma radiation source. In this figure, reference numerals 41 and 42 represent vacuum chambers for preventing soft X rays from being absorbed into the atmosphere, which have thin windows 43 and 44 transmitting the soft X rays on adjacent walls. Reference numeral 45 denotes a laser plasma radiation source disposed In the vacuum chamber 41, and 46 denotes a condenser lens utilizing total reflection, disposed in the vacuum chamber 41, which has a spheroidal structure. Numeral 47 represents a sample base placed in the atmosphere between the windows 43 and 44. Numeral 48 designates a Schwarzschild reflecting objective lens using a multilayer film, disposed in the vacuum chamber 42. This multilayer film consists of alternating contiguous layers of Ni and Ti and is used in a "water window" (wavelengths of 23 to 44 Å) region. Numeral 49 designates an AMI of the lamination type photodiode structure disposed in the vacuum chamber 42, on the surface which is formed an A1 surface electrode layer 200 thick. To improve the spectral sensitivity characteristic of the AMI 49, a filter 100 to 1000 Å thick may be built up on the Al surface electrode layer.

The laser plasma radiation source 45 emits radiation of successive wavelengths, which contains visible light as well as soft X rays. The condenser lens 46 uses a metal and the Schwarzschild reflecting objective lens 48 also uses a metal, so that visible light undergoes resulting metallic reflection and the visible-light image of a sample is incident on the AMI 49 along with soft X rays. The visible-light .image, however, can be effectively removed by the Al surface electrode layer of the AMI 49, while the soft X rays are surely detected and converted photoelectrically by the photoelectric conversion layer of the AMI 49. Thus, the microscopic observation of high resolution can be realized. The same holds for the case where spectral radiation containing visible light, instead of the laser plasma radiation source 45, is employed.

EXAMPLE 8

Figure 7:
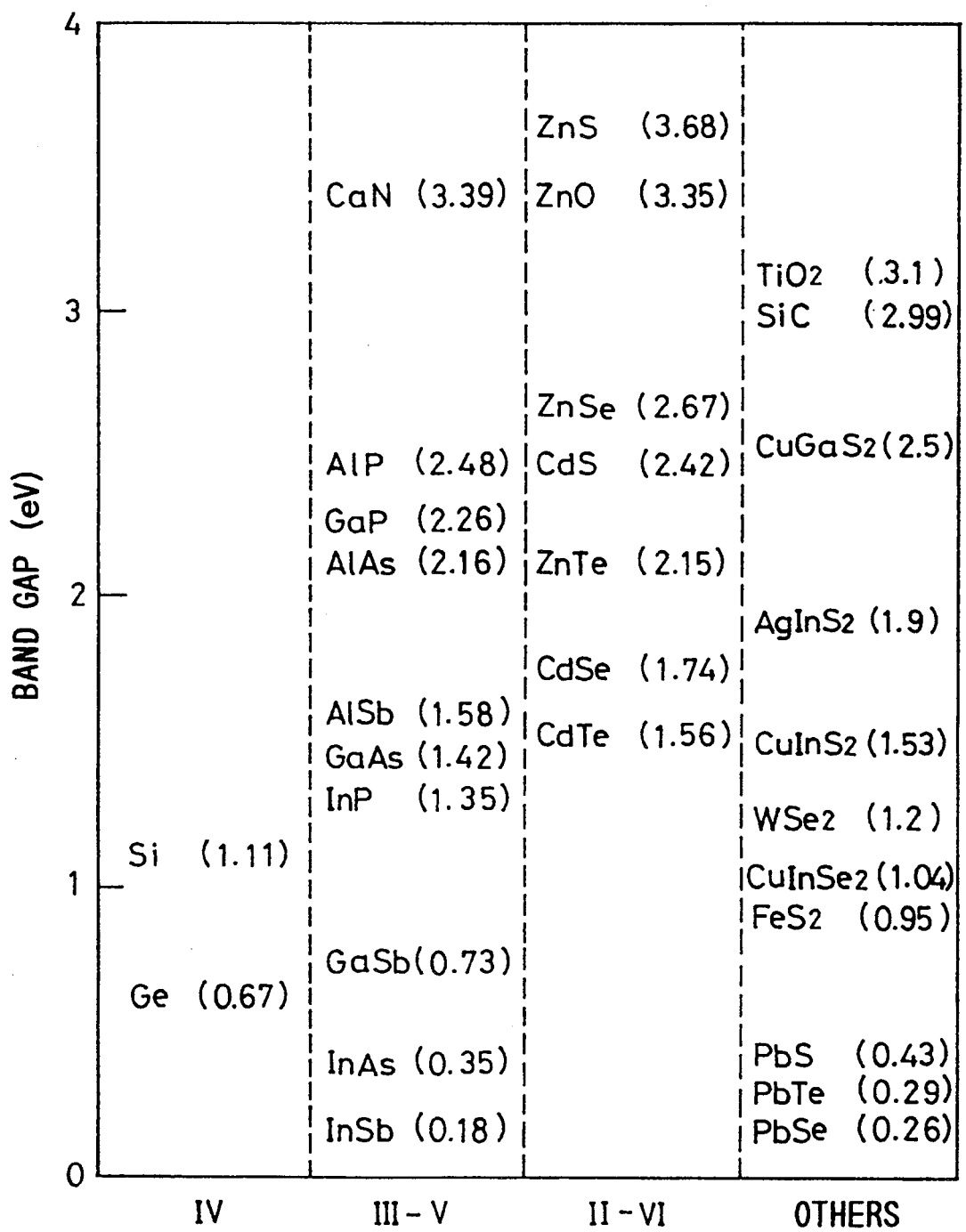
FIG. 7 is a chart showing the band gaps of principal semiconductors at room temperature.

According to FIGS. 6 and 7, it is seen that most of the semiconductors contain a band gap of 3 eV (corresponding to 4000 Å which is the shortest wavelength of lo visible light) or less, and have sensitivity with respect to the visible-light region. Some of diamond, ZnS, ZnO, and others, however, contain more than 3 eV band gap, and for visible light or ultraviolet light, they are difficult to excite sufficiently the valence electrons to the conduction band. These substances have an extremely low sensitivity to visible and ultraviolet light.

On the other hand, soft X rays have a photon energy of about 20 eV or more and can thus excite sufficiently the valence electrons to the conduction band. Diamond has more than 5 eV band gap in particular and is considerably low In sensitivity to visible and ultraviolet light. Furthermore, diamond has a very high mobility of carriers and is peculiarly suitable for the detection of soft X rays. Hence, If a substance, such as diamond, having a band gap of 3 eV or more and a high carrier mobility is used for the photoelectric conversion layer, the soft X-ray detector can be obtained which has selectively sensitivity in the soft X-ray region.

In FIG. 11, the soft X-ray detector is the laminated soft X-ray image sensor utilizing diamond for the photoelectric conversion layer 31 (FIG. 4), and its specification is as follows:
Wave length of soft X rays to be Imaged: 39.8 Å
Surface electrode layer 32 (FIG. 4): Al, 0.05 μm thick.
Photoelectric conversion layer (FIG. 4): C diamond, 0.2 μm thick.
Calculations of the transmittances of visible Night and soft X rays from Eq. (1), based on the data of Henke et al. (FIGS. 9A and 9B), result in $4.8 \times 10^{-4}$ for visible light and 0.73 for soft X rays. Consequently, the visible light will reach the photoelectric conversion layer. Since, however, the band gap of diamond constituting the photoelectric conversion layer, as seen from FIG. 6, exceeds 5 eV, visible and ultraviolet light having wavelengths of more than 0.2 μm cannot produce carriers within the photoelectric conversion layer. The detector according to the present invention did not entirely detect such light. Also, it is found from Eq. (1) that if the diamond layer for the photoelectric conversion layer is of a thickness of 0.2 μm or more, at least 90% of soft X rays of wavelength 39.8 Å is absorbed and detected effectively.

Second embodiment

Figure 12:
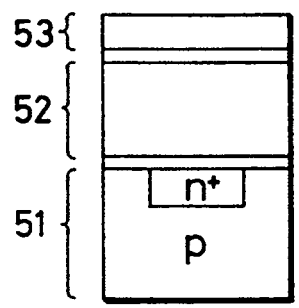
FIG. 12 is a longitudinal sectional view of a laminated solid-state image sensor showing a fundamental structure of the soft X-ray detector according to the present invention.
Figure 13:
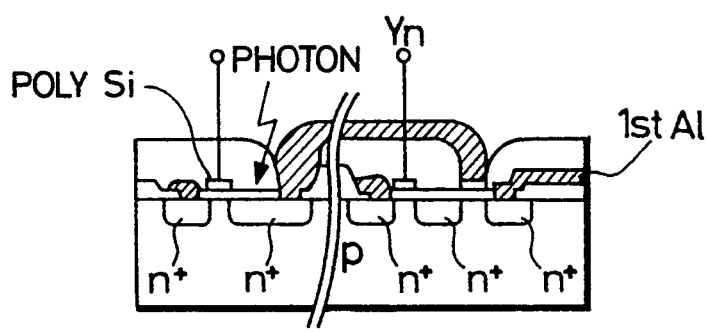
FIG. 13 is a longitudinal sectional view showing an example of an amplified NOS imager utilized in the structure shown in FIG. 12.

The soft X-ray detector of the present invention can be constructed as the laminated solid-state image sensor having a pixel structure such as shown in FIG. 12. In this figure, a photoelectric conversion layer 52 is laminated on a photodiode section 51 provided with a pixel electrode, and a surface electrode layer 53 is built up on the photoelectric conversion layer 52. The surface electrode layer 53 is composed of an electrode section and a filter section, which is formed of different substances according to individual pixels. The photodiode section 51 may have the structure of the AMI such as shown in FIG. 13.

Radiation incident on the surface electrode layer 53 reaches directly the photoelectric conversion layer 52 and produces electrons and holes in pairs. In this case, radiation to be converted photoelectrically is chosen for every pixel In accordance with the substances of the filter section. If the substance of the photoelectric conversion layer 52 is a semiconductor, such as Si, the quantum efficiency will be improved and a higher sensitivity will be obtained. Thus, the electric charge is stored in the photodiode section 51 and the stored charge is read out through a readout circuit.

Figure 14A:
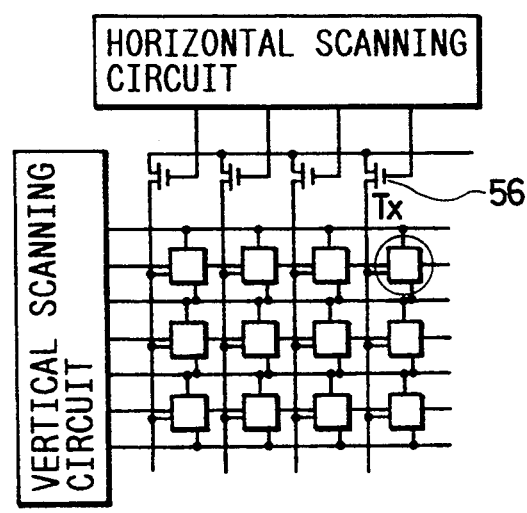
FIGS. 14A and 14B are an explanatory view for the operation and configuration of the amplified NOS imager and a partially enlarged view thereof, respectively.
Figure 14B:
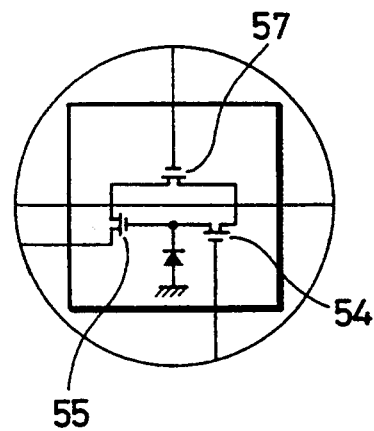

In the AMI, on the other hand, the signal is amplified within the pixel and then read out. Referring to FIGS. 14A and 14B, its operation is performed as follows: Each photodiode shown In FIG. 13 is first set to a reset voltage by a reset FET 54. It then absorbs electrons according to Incident radiation to reduce its potential. Subsequently, the potential is amplified by an amplification FET 55 and taken out from the image sensor by a horizontal selection FET 56 and a vertical selection FET 57.

Based on FIGS. 15 and 16, a second embodiment of the soft X-ray detector according to the present invention will be described below.

The soft X-ray detector of the present invention is composed of at least two kinds of pixels having sensitivity to radiation in different wavelength bands. This embodiment particularly uses one pixel (pixel A) having sensitivity to soft X rays only and the other pixel (pixel B) having sensitivity to visible light only. In FIG. 15, reference numeral 61 represents a photodiode section; 62 a photoelectric conversion layer; and 63 a surface electrode layer.

The pixels A and B have the same structure, except that the filter sections of the surface electrode layer 63 are different from each other in constituent substance and thickness. Table 9 shows a transmittance Tx of soft X rays and a transmittance Tv of visible light in each filter section of a thickness d (μm).

TABLE 9

| | | Substance | d | Tx | Tv |
|---|---|---|---|---|---|
| Pixel | A | Rh | 0.1 | $5.9 \times 10^{-1}$ | $6.2 \times 10^{-6}$ |
| | B | Li F | 10 | $6.9 \times 10^{-5}$ | 1 |

The transmittances Tx and Tv in Table 9 are calculated from Eq. (1). The absorption coefficient k is used in terms of a 40.92 Å wavelength for soft X rays and a 0.4769 μm wavelength for visible light (however, a 0.4880 μm wavelength for the pixel B for visible light) (Handbook of Optical Constants of Solid).

Figure 16:
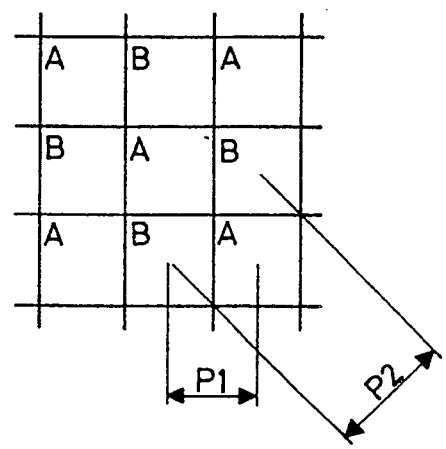
FIG. 16 is a plan view showing an example of the array of pixels in the second embodiment.

FIG. 16 illustrates an example of the array of the pixels A and B where the image sensor of the present invention is viewed from the incidence side. As evident from this figure, the pixels A and B are alternately distributed In orderly and uniform array on the light-receiving surface.

Because the soft X-ray detector of the present invention is constructed as mentioned above, the pixel A blocks visible light in the surface electrode layer 63, while the pixel B blocks soft X rays. In this way, the pixels A and B have different functions and hence the images or soft x rays and visible light can be brought about. Also, In is chosen as the constituent substance of the surface electrode layer 63, while Si is chosen as the photoelectric conversion layer 62, and their thicknesses are properly set.

In order to obtain the image of radiation of a desired wavelength band from the pixels A and B arrayed as shown in FIG. 16, data corresponding to the array concerning a predetermined pixel are taken out from among total data obtained from the pixels A and B, and these data are rearranged. Thus, the desired Image can easily be secured. To obtain the image of soft X rays, for example, it is only necessary to take out the data corresponding to the pixel A. Also, where the pitch of the array of the pixels A and B is P1, as shown In FIG. 16, that concerning either one of the pixels A and B becomes P2 ($=P1 \times \sqrt{2}$). That is, the pixel pitch for a particular wavelength region is P2, but it is much smaller than the pitch of a standard MCP because P1 is equivalent to the order of 10 μm. In other words, a high resolution is ensured.

Further, the use of the AMX (FIG. 13) in the second embodiment makes it possible to realize the detection of higher resolution. Although, In the second embodiment, the case of the use of soft X rays and visible light has been described as an instance, an effective application to other wavelength bands, of course, is possible.

Third embodiment

Figure 15:
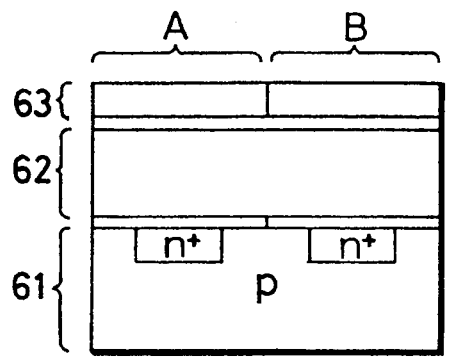
FIG. 15 is a longitudinal sectional view showing a structure of a second embodiment of the present invention.
Figure 17:
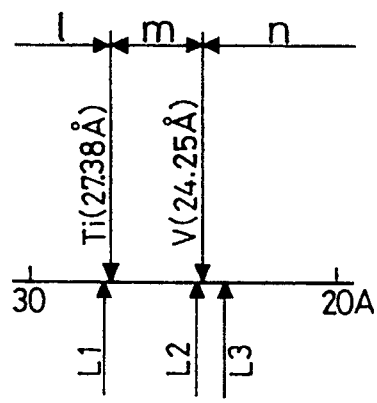
FIG. 17 is a view showing the relationship between the wavelength and the absorption edge of the substance forming a filter section of the surface electrode layer in a third embodiment.

Referring to FIGS. 15 to 17, a third embodiment of the soft X-ray detector according to the present invention will be explained below.

The soft X-ray detector of the present invention is composed of at least two kinds of pixels in which the constituent substances of the surface electrode layer are different from each other. As In the second embodiment of FIG. 15, the pixels A and B are used. They have the same structure, except that the filter sections of the surface electrode layer 63 are different from each other In constituent substance and thickness. Table 10 shows transmittances T1, T2, and T3 concerning soft X rays of three kinds of wavelengths L1, L2, and L3 in each filter section of a thickness d (μm).

TABLE 10

|       | Substance | d    | T1                  | T2                  | T3                  |
|-------|-----------|------|---------------------|---------------------|---------------------|
| Pixel A | V       | 0.1  | $8.0 \times 10^{-1}$ | $8.4 \times 10^{-1}$ | $2.3 \times 10^{-1}$ |
| B     | Ti        | 0.15 | $8.0 \times 10^{-1}$ | $2.0 \times 10^{-1}$ | $2.2 \times 10^{-1}$ |

The transmittances T1, T2, and T3 in Table 10 are calculated from Eq. (1). The absorption coefficient k is used In terms of the wavelengths L1=27.4 Å, L2=24.3 Å, and L3 : 23.6 Å, and is calculate from Henke's table.

The pixels A and B, as In FIG. 16, are distributed In orderly and uniform array on the light-receiving surface. They are arranged alternately along the light-receiving surface.

The soft X-ray detector of the present invention is constructed as mentioned above. FIG. 17 shows the relationship between the wavelengths L1, L2, and L3 and the absorption edges of the constituent substances of the filter sections of the surface electrode layer 63. That is, by taking the difference between the signals derived from the pixels A and B, it is possible to leave the signal of a wavelength region m and make the signals of wavelength regions 1 and n smaller than that of the wavelength region m. Calculation of a difference S between the transmittances of the wavelengths L1, L2, and L3 as the typical values of respective wavelength regions leads to $S1 = 1.1 \times 10^{-2}$, $S2 = 6.4 \times 10^{-1}$, and $S3 = 1.0 \times 10^{-2}$. From this fact, it is also seen that the wavelength region m is enhanced. This dispenses with the need to take account of the difference of absorption due to different wavelengths In the filter sections and the photoelectric conversion layer 62. However, incident radiation is taken to be limited to the radiation of the soft X-ray region alone. Also, A1 is chosen as the constituent substance of the surface electrode layer 63, while S1 is chosen as the photoelectric conversion layer 62, and their thicknesses are properly set.

The pixels A and B are arrayed as in FIG. 16 so that adjacent pixels A and B form pairs and the process for taking the difference of the signal is performed between them. Also, where the pitch of the array of the pixels A and B is P1, as Illustrated In FIG. 16, that concerning either one of the pixels A and B becomes P2 (: $P1 \times \sqrt{2}$). That is, the pixel pitch for a particular wavelength region is P2, but it is much smaller than the pitch of a standard MCP because P1 is equivalent to the order of 10 μm. In other words, a high resolution is ensured.

Fourth embodiment

Figure 18:
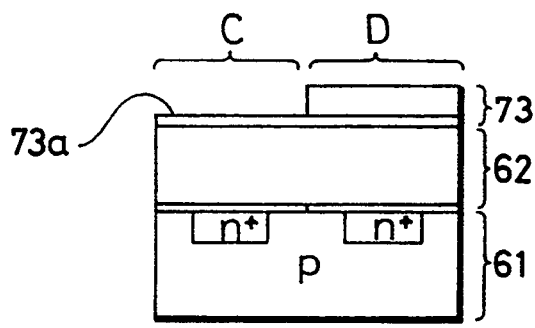
FIG. 18 is a longitudinal sectional view showing a structure of a fourth embodiment of the present Invention.

FIG. 18 shows a fourth embodiment of the soft X-ray detector of the present Invention. In this embodiment, one pixel C is such that a surface electrode layer 73 consists of an electrode section 73a alone. The other pixel is represented by D. By taking the difference between the signals derived from the pixels C and D, it is possible to effectively remove the radiation of longer wavelengths than the absorption edge of the constituent substance of the filter section of the pixel D.

Figure 19:
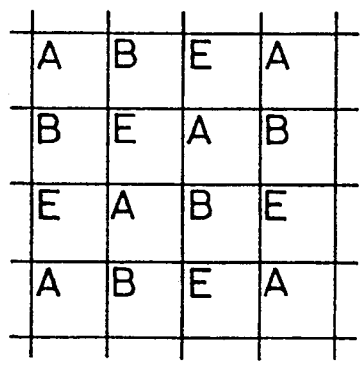
FIG. 19 is a plan view showing another example of the array of the pixels.

In the soft X-ray detector of the present invention, at least three kinds of pixels are chosen and combined properly, thereby enabling arbitrary switching of wavelength to be enhanced. For example, three kinds of pixels A, B, and E are arrayed as shown in FIG. 19. Also, by using the AMI In respective embodiments, it is possible to realize the detection of higher sensitivity.

What is claimed is:

1. An X-ray detector comprising: in order from an incidence side of radiation,
   a surface electrode layer;
   a photoelectric conversion layer; and
   a semiconductor detector having an electrode connected to said photoelectric conversion layer, for detecting an electric charge produced in said photoelectric conversion layer,
   wherein said photoelectric conversion layer and said surface electrode layer have thicknesses satisfying conditions $$dA \geqq 0.183\lambda/KA$$

$$dB \leqq 0.183\lambda/KB$$

where dA is a thickness of the photoelectric conversion layer, dB is a thickness of the surface electrode layer, KA is an extinction coefficient of radiation of a wavelength λ in a substance constituting the photoelectric conversion layer, and KB is an extinction coefficient of radiation of the wavelength λ in a substance constituting the surface electrode layer.

2. The X-ray detector according to claim 1, further comprising a visible-light blocking filter provided on an entrance side of said surface electrode layer, with a thickness satisfying a condition $$dc \geqq 0.366/(KVF/\lambda V - KXF/\lambda X)$$

where dc is a thickness of the filter, KVF is an extinction coefficient of radiation of a wavelength λV in a substance constituting the filter, and KXF is an extinction coefficient of soft X rays of a wavelength λX in a substance constituting the filter.

3. The X-ray detector according to claim 2, wherein said filter has a thickness satisfying a condition $$dc \leqq 0.183\, \lambda X/KXF$$

4. The X-ray detector according to claim 3, wherein said photoelectric conversion layer includes a semiconductor.

5. The X-ray detector according to claim 4, wherein said filter includes a metal.

6. An X-ray detector comprising: in order from an incidence side of radiation,
   a surface electrode layer;
   a photoelectric conversion layer; and
   a semiconductor detector having an electrode connected to said photoelectric conversion layer, for detecting an electric charge produced in said photoelectric conversion layer,
   wherein said photoelectric conversion layer and said surface electrode layer have thicknesses satisfying conditions $$dE \geqq 0.183\, \lambda X/KXE$$

$$dF \geqq 0.366/(KV/\lambda V - KX/\lambda X)$$

$$dF \leqq 0.183\, \lambda X/KX$$

where dE is a thickness of the photoelectric conversion layer, dF is a thickness of the surface electrode layer, KXE is an extinction coefficient of soft X rays of a wavelength λX in a substance constituting the photoelectric conversion layer, KV is an extinction coefficient of visible light of the wavelength λV in a substance constituting the surface electrode layer, and KX is an extinction coefficient of soft X rays of the wavelength λX in a substance constituting the surface electrode layer.

7. The X-ray detector according to claim 6, wherein said photoelectric conversion layer includes a semiconductor.

8. A soft X-ray detector comprising:
a solid-state image sensor having a plurality of pixels;
a photoelectric conversion layer provided on pixel electrodes of said solid-state image sensor; and
a surface electrode layer provided on said photoelectric conversion layer,
wherein said photoelectric conversion layer is constructed of a substance having a band gap of at least 3 eV.

9. A soft X-ray detector comprising:
a solid-state image sensor having a plurality of pixels;
a photoelectric conversion layer connected to pixel electrodes of said solid-state image sensor; and
a surface electrode layer provided on said photoelectric conversion layer,
wherein said plurality of pixels of said solid-state image sensor includes two kinds of pixels having sensitivity to radiation of wavelength bands different from each other.

10. The soft X-ray detector according to claim 9, wherein one of said two kinds of pixels has sensitivity to soft X rays and the other pixel has sensitivity to visible light so that said two kinds of pixels are alternately arrayed on a light-receiving surface of said solid-state image sensor.

11. The soft X-ray detector according to claim 10, wherein a substance constituting said surface electrode layer Includes at least two kinds of pixels different from each other.

12. A soft X-ray detector comprising:
a solid-state image sensor having a plurality of pixels;
a photoelectric conversion layer connected to pixel electrodes of said solid-state Image sensor; and
a surface electrode layer provided on said photoelectric conversion layer,
wherein said surface electrode layer is divided into a plurality of regions corresponding to said plurality of pixels of said solid-state Image sensor, said plurality of regions Including a first class of region composed of one substance and a second class of region composed of another substance different from said one substance.

13. A soft X-ray detector comprising:
a solid-state Image sensor having a plurality of pixels;
a photoelectric conversion layer connected to pixel electrodes of said solid-state Image sensor; and
a surface electrode layer provided on said photoelectric conversion layer,
wherein a surface of said surface electrode layer is divided into a first class of region provided with a filter which corresponds to each of said plurality of pixels and which is equal In size thereto, and a second class of region from which said filter is excluded.

14. The soft X-ray detector according to claims 12 or 13, wherein said first class of region and said second class of region are alternately arrayed.

15. The soft X-ray detector according to claims 12 or 13, further comprising means for calculating a difference between a signal derived from said first class of region and another signal derived from said second class of region.

* * * * *